United States Patent
Karnik et al.

(10) Patent No.: US 6,380,781 B1
(45) Date of Patent: Apr. 30, 2002

(54) SOFT ERROR RATE TOLERANT LATCH

(75) Inventors: Tanay Karnik; Krishnamurthy Soumyanath, both of Portland; Shekhar Y. Borkar, Beaverton, all of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/430,977

(22) Filed: Nov. 1, 1999

(51) Int. Cl.[7] .................................................. H03K 3/12
(52) U.S. Cl. ........................ 327/215; 327/203; 327/208; 326/98
(58) Field of Search .............................. 326/93, 95, 98, 326/36, 112, 119; 365/154, 156, 185.01; 327/199, 200–203, 206, 207, 208, 215, 219, 534, 535, 541, 281

(56) References Cited

U.S. PATENT DOCUMENTS 5,498,989 A * 3/1996 Diba ........................... 327/230
5,552,738 A * 9/1996 Ko .............................. 327/203
6,104,234 A * 8/2000 Shin et al. ................... 327/535

* cited by examiner

*Primary Examiner*—Timothy P. Callahan
*Assistant Examiner*—Minh Nguyen
(74) *Attorney, Agent, or Firm*—Schwegman, Lundberg, Woessner & Kluth, P.A.

(57) ABSTRACT

A latch having increased soft error rate tolerance includes cross-coupled inverters having transistors with varying sizes. Diffusion regions of transistors coupled to storage nodes are kept small to reduce the effect of charge accumulation resulting from particles bombarding the bulk of an integrated circuit die. Transistors having gates coupled to the storage nodes are increased in size to increase the capacitance on the storage nodes. The reduced size of diffusion regions and increased size of gates on storage nodes combine to reduce the effects of accumulated charge. Diffusion region area is further reduced by reducing the size of pass gates that load normal data and scan data. A large capacitor is coupled to a feedback node within the cross-coupled inverters to further reduce the effect of accumulated charge.

24 Claims, 4 Drawing Sheets

US 6,380,781 B1

SOFT ERROR RATE TOLERANT LATCH

FIELD

The present invention relates generally to integrated circuits, and more specifically to integrated circuits having increased soft error rate tolerance.

BACKGROUND

Integrated circuits commonly include components such as latches that retain state information and hold data. During a portion of a time cycle, or clock period, these components hold data to be used during subsequent time cycles. When integrated circuit components reliably retain data, computations can be error free. In contrast, when integrated circuit components do not reliably retain data, computation errors can result.

Cosmic rays and charged particles can cause integrated circuits to be unreliable. When particles bombard portions of integrated circuits, localized areas of charge can build up on an integrated circuit die and cause stored information to be upset. For example, latches having transistors with diffusion regions can be susceptible to bombardment of charged particles. As particles bombard an integrated circuit die about a diffusion region held at a low voltage, the voltage can increase. Likewise, as particles bombard an integrated circuit about a diffusion region held at a high voltage, the voltage can decrease. When the bombardment is significant, the change in voltage in the diffusion region can cause the latch to change state, thereby causing an error to occur.

When an area of an integrated circuit is bombarded with rays or particles, holes and electrons are generated. The generated holes and electrons accumulate charge in localized areas of the integrated circuit. If charge accumulates beyond a device's ability to withstand it, "soft errors" occur. A "soft error" is an error resulting in a change in stored data. For example, a latch within an integrated circuit may be able to withstand a given rate of bombardment without changing the logical state of the latch. When the given rate of bombardment is surpassed, the charge accumulates and causes a soft error.

FIG. 1 shows a prior art latch. Latch 90 includes forward inverter 40 and feedback inverter 10 cross-coupled together. Forward inverter 40 drives feedback node 4 which is input to feedback inverter 10. Feedback inverter 10 in turn drives storage node 2 which is input to forward inverter 40.

When latch 90 is holding data, storage node 2 is at a stable logical state of either logical "1" or logical "0," and buffer 80 drives data output node 85. Forward inverter 40 receives the stored data value on storage node 2, and drives feedback node 4 to the opposite logical state than that of storage node 2. Feedback inverter 10 receives the opposite logical state on feedback node 4, and drives storage node 2 with the original stored data value.

Transistors within inverters have device sizes associated therewith. For example, within feedback inverter 10, NFETs 16 and 20 each occupy an area "y" of an integrated circuit die. Likewise, within forward inverter 40, NFETs 46 and 50 each occupy an area "x" of the integrated circuit die. As used herein, the term NFET describes N channel field effect transistors, of which N channel Metal Oxide Semiconductor (NMOS) FETs are an example, and the term PFET describes P channel field effect transistors, of which P channel Metal Oxide Semiconductor (PMOS) FETs are an example.

Transistors within pass gates also have device sizes associated therewith. For example, in one pass gate, PFET 60 occupies an area "w1," and NFET 62 occupies an area "w2." Likewise, in another pass gate, PFET 70 occupies an area "z1," and NFET 72 occupies an area "z2." The ratio of area w1 to area w2 is typically about 2.5 to 1 because at this ratio, PFETs and NFETs have substantially equal drive strengths. This is also true of the ratio of area z1 to area z2.

FET devices include diffusion regions coupled to the drain of the FET and the source of the FET. Diffusion regions can collect charge resulting from cosmic rays and particles that bombard the integrated circuit die. Particles that bombard the bulk of the integrated circuit die can cause negatively charged electrons or positively charged holes to collect in diffusion regions of FETs and cause soft errors.

For the reasons stated above, and for other reasons stated below which will become apparent to those skilled in the art upon reading and understanding the present specification, there is a need in the art for integrated circuit elements tolerant of high soft error rates.

SUMMARY

In one embodiment, an inverter includes an input node, an output node, and a pullup device coupled between a reference node and the output node. The inverter further includes a plurality of pulldown devices coupled in series between the output node and a second reference node, the plurality of pulldown devices occupying unequal areas.

In another embodiment, an inverter having increased soft error rate tolerance includes a PFET having a gate coupled to an input node, and a diffusion region coupled to an output node. The inverter further includes a first NFET having a gate coupled to the input node, a first diffusion region, and a second diffusion region coupled to a second reference node. The inverter additionally includes a second NFET having a gate coupled to a control input, and having a first diffusion region coupled to the output node and a second diffusion region coupled to the first diffusion region of the first NFET, wherein the first diffusion region of the first NFET is a different size than the first diffusion region of the second NFET.

In another embodiment, a latch having increased soft error rate tolerance includes a forward inverter having an input coupled to a storage node and an output coupled to a feedback node, and a feedback inverter having an input coupled to the feedback node and an output coupled to the storage node. In this embodiment, the feedback inverter includes a first pulldown device coupled to a first reference node, the first pulldown device having a control input coupled to the input of the feedback inverter, and a second pulldown device coupled between the first pulldown device and the output of the feedback inverter, the second pulldown device having a control input coupled to a latch load node of the latch. Also in this embodiment, a feedback node capacitance resulting from the control input of the first pulldown device is greater than a latch load node capacitance resulting from the control input of the second pulldown device.

DESCRIPTION OF EMBODIMENTS

Figure 1:
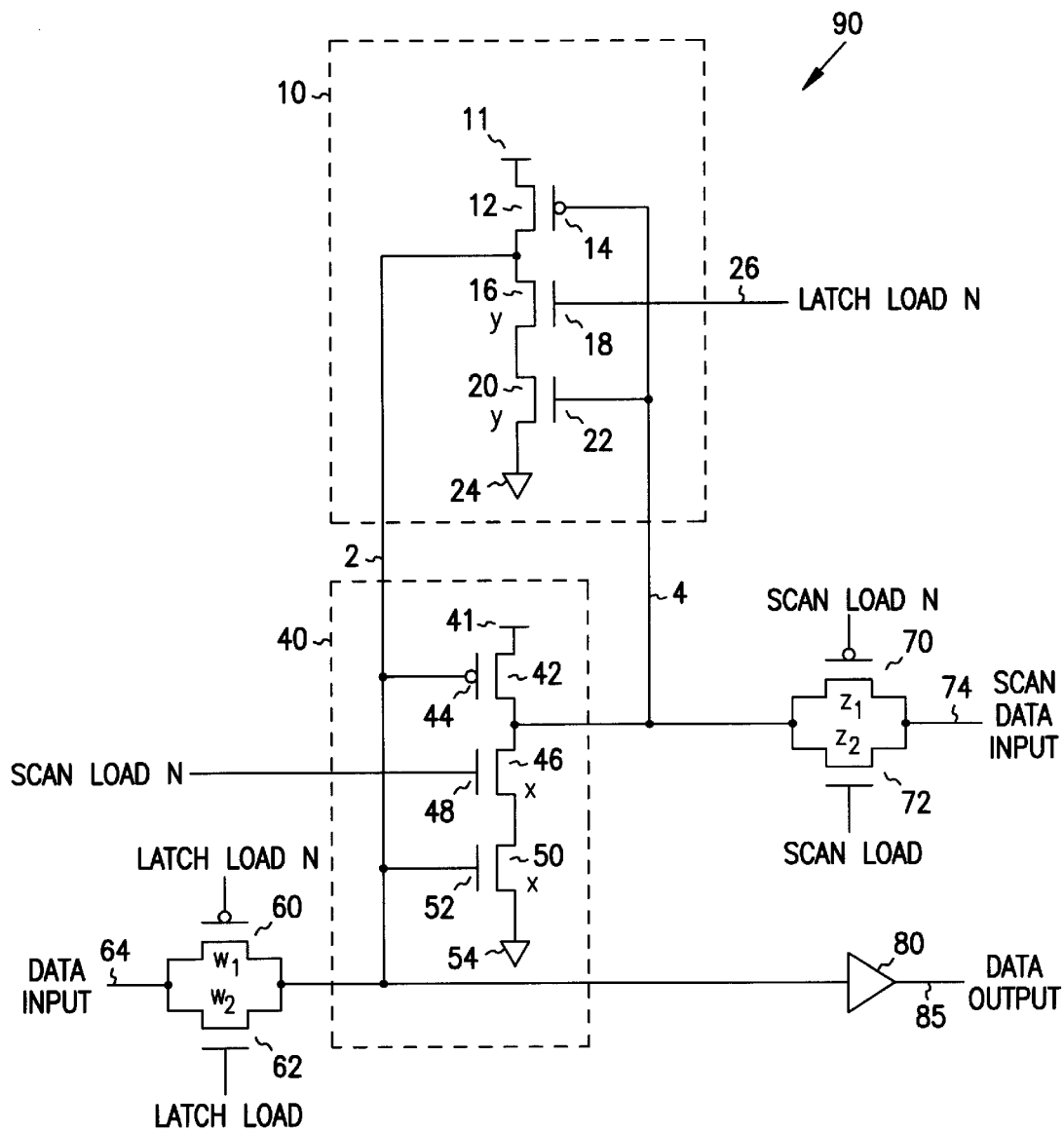
FIG. 1 is a prior art latch.

In the following detailed description of the embodiments, reference is made to the accompanying drawings which show, by way of illustration, specific embodiments in which the invention may be practiced. In the drawings, like numerals describe substantially similar components throughout the several views. These embodiments are described in sufficient detail to enable those skilled in the art to practice the invention. Other embodiments may be utilized and structural, logical, and electrical changes may be made without departing from the scope of the present invention. Moreover, it is to be understood that the various embodiments of the invention, although different, are not necessarily mutually exclusive. For example, a particular feature, structure, or characteristic described in one embodiment may be included within other embodiments. The following detailed description is, therefore, not to be taken in a limiting sense, and the scope of the present invention is defined only by the appended claims, along with the fall scope of equivalents to which such claims are entitled.

Various embodiments of circuits are described with reference to circuit nodes having states of logical "1" and logical "0." Circuit nodes are also described as having high voltage and low voltage signals applied thereto. The terms logical "1" and logical "0" generally correspond to a high voltage and a low voltage, respectively. The "logical" terms are used when describing the logical operation of a circuit, and the "voltage" terms are used when describing the circuit more fully. One skilled in the art will understand that a logical inversion can take place while still practicing the present invention. For example, the term logical "1" can correspond to a low voltage, and the term logical "0" can correspond to a high voltage without departing from the scope of the present invention.

Figure 2A:
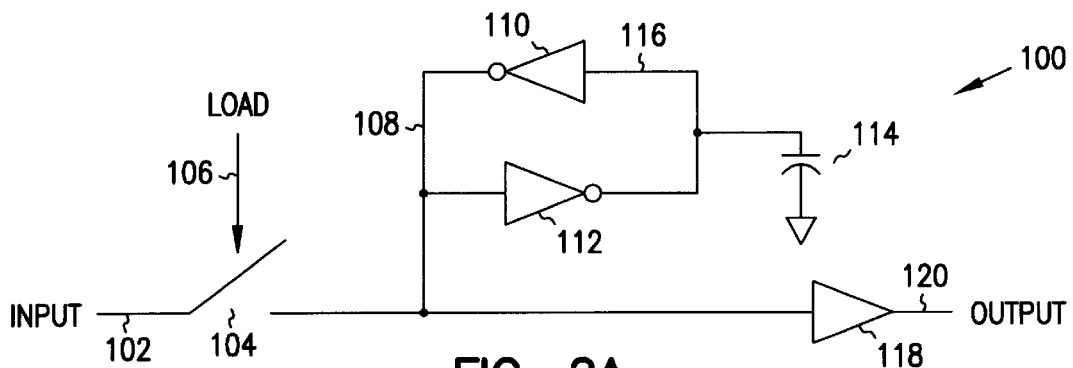
FIG. 2A is a simplified diagram of a latch according to one embodiment of the present invention.

FIG. 2A shows a latch according to one embodiment of the present invention. Latch 100 includes forward inverter 112, feedback inverter 110, buffer 118, capacitor 114, and switch 104. Inverters 110 and 112 are cross-coupled such that when in steady-state, they latch a data value. When the output of feedback inverter 110 is a logical "0," the input of forward inverter 112 is also a logical "0." The output of forward inverter 112 is a logical "1," which causes the output of feedback inverter 110 to remain in its present state of logical "0." One can see, therefore, that cross-coupled inverters 110 and 112 work to latch a logical state. The logical state currently latched is input to buffer 118, which in turn drives output node 120. Buffer 118 can be any inverting or non-inverting buffer capable of providing drive strength for coupling output node 120 to other circuits.

Latch 100 is loaded when switch 104 is closed as a result of control input 106 having a signal asserted thereon. In the embodiment of FIG. 2A, control input 106 is driven with a "load" signal that causes switch 104 to close. When switch 104 is closed, input node 102 is coupled to storage node 108. If data is present on input node 102, the input of forward inverter 112 is driven with the data. If the data is the same as the previous data stored on storage node 108, then latch 100 does not change state. If the data is not the same as the previous data on storage node 108, forward inverter 112 changes state, which causes feedback inverter 110 to change state, resulting in latch 100 changing state.

When latch 100 is changing state, capacitor 114 is charged. Forward inverter 112 first changes state as a result of storage node 108 changing state. Forward inverter 112 charges capacitor 114, and when capacitor 114 is charged past the input threshold voltage of feedback inverter 110, feedback inverter 110 changes state. If capacitor 114 does not charge past the input threshold of feedback inverter 110, feedback inverter 110 will not change state.

When charge accumulation occurs inside forward inverter 112, the output of forward inverter 112 which is coupled to feedback node 116 can accumulate charge. For example, when the output of forward inverter 112 has a low voltage present thereon, if positively charged particles accumulate on the output of forward inverter 112, the voltage can increase. If the voltage increases beyond the input voltage threshold of feedback inverter 110, feedback inverter 110 can change state, thereby changing the state of the latch and causing a soft error. Capacitor 114 presents a load on feedback node 116 that allows latch 100 to be more tolerant of charge accumulation. As charge builds up on the output of forward inverter 112, capacitor 114 accepts the charge while allowing the voltage on feedback node 116 to change more slowly. As a result, latch 100 is more soft error rate tolerant.

Figure 2B:
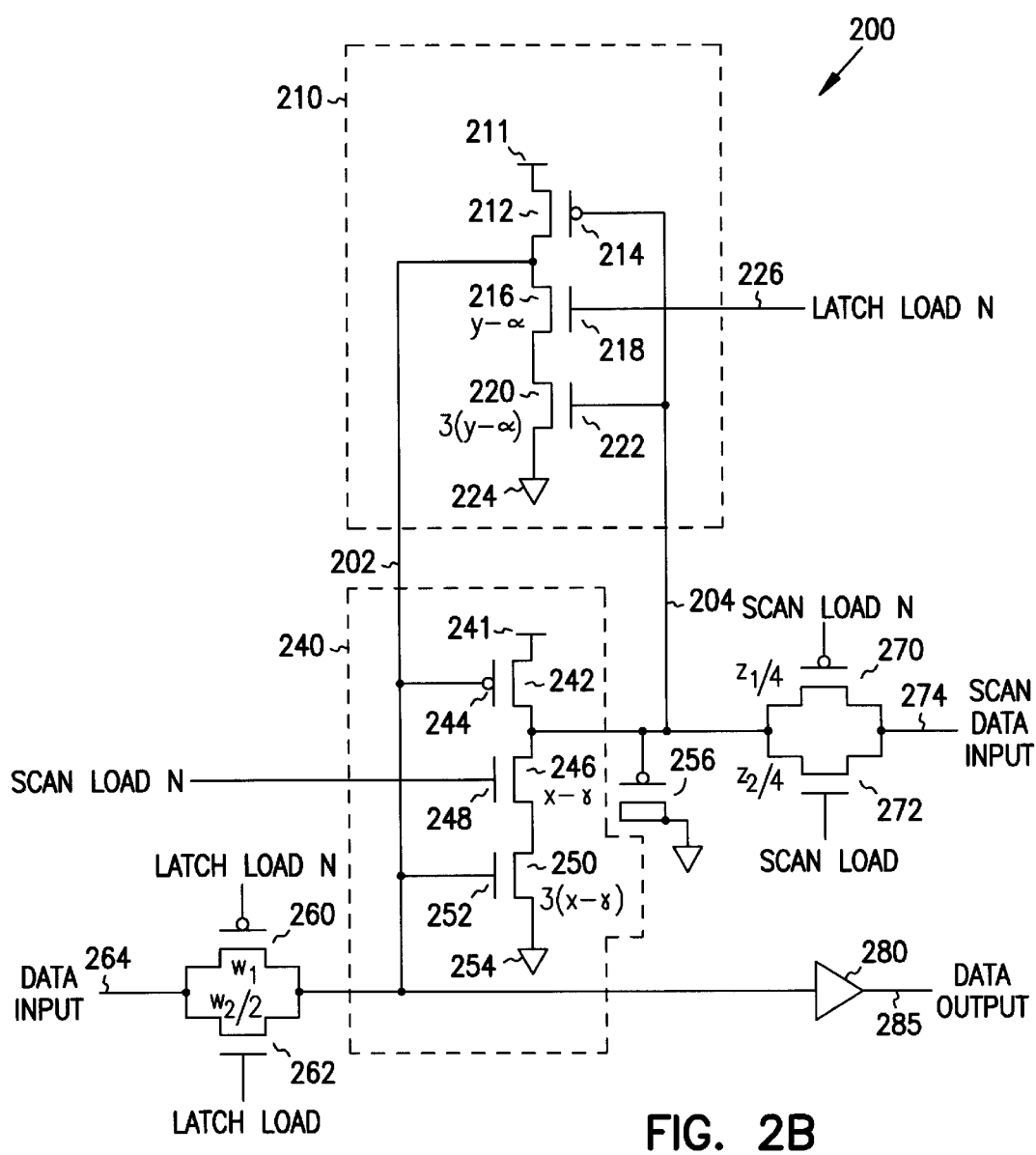
FIG. 2B is a more detailed diagram of a latch according to one embodiment of the present invention.

FIG. 2B is a more detailed diagram of a latch according to one embodiment of the present invention. Latch 200 includes forward inverter 240 and feedback inverter 210 cross-coupled together. Forward inverter 240 drives feedback node 204 which is input to feedback inverter 210. Feedback inverter 210 in turn drives storage node 202 which is input to forward inverter 240. The cross-coupled operation of forward inverter 240 and feedback inverter 210 is analogous to the operation of cross-coupled inverters 110 and 112 (FIG. 2A).

When latch 200 is holding data, storage node 202 is at a stable logical state of either logical "1" or logical "0," and buffer 280 drives data output node 285. Buffer 280 can be any type of buffer capable of driving data output node 285. In the embodiment of FIG. 2B, buffer 280 is non-inverting. In another embodiment, buffer 280 is an inverter. Latch 200 is loaded when a data signal on data input node 264 drives storage node 202 by virtue of the input pass gate being on. The input pass gate includes switches 260 and 262 coupled in parallel. In the embodiment of FIG. 2B, switch 260 is a PFET and switch 262 is an NFET. Switches 260 and 262 are driven with complementary "latch load" signals. When the LATCH LOAD signal is high, the LATCH LOAD N signal is low and both switches 260 and 262 are on, thereby driving storage node 202 with data from data input node 264.

Forward inverter 240 receives the stored data value on storage node 202, and drives feedback node 204 with a signal having the opposite logical state. Feedback inverter 210 receives the opposite logical state on feedback node 204, and drives storage node 202 with the original stored data value. Thereafter, when the input pass gate including switches 260 and 262 is off, latch 200 retains the logical state on storage node 202. Feedback inverter 210 also receives the LATCH LOAD N signal on latch load input node 226. Latch load input node 226 is coupled to gate 218 of NFET 216. When latch 200 is loaded, the LATCH LOAD N signal on latch load input node 226 is low, thereby turning off NFET 216. When NFET 216 is turned off, the lower portion of feedback inverter 210 is turned off, thereby allowing storage node 202 to change state during loading.

When storage node 202 is transitioning from a low voltage to a high voltage, latch 200 begins with a low voltage on storage node 202 and a high voltage on feedback node 204. As a result of the high voltage on feedback 204, NFET 220 is on, and PFET 212 is off. During the transition, NFET 216 is turned off as previously described, and storage node 202 is free to transition from a low voltage to a high voltage. When storage node 202 transitions from a high voltage to a low voltage, the operation is slightly different. Latch 200 starts with storage node 202 at a high voltage and with feedback node 204 at a low voltage. During the transition, NFET 216 is turned off as previously described, however, PFET 212 is on thereby attempting to pull up storage node 202 while storage node 202 is being driven low by the input pass gate. PFET 212 is a weak device such that the input pass gate can overcome the drive strength of PFET 212 and drive storage node 202 low long enough for inverter 240 to drive feedback node 204 high, which in turn presents a high voltage on gate 214 thereby turning off PFET 212.

In some embodiments, latch 200 can also be loaded with scan data. In some embodiments, scan data is used primarily for testing purposes, and is not used during normal operation of the latch. Scan data is loaded into latch 200 through the scan data input pass gate that includes switches 270 and 272. In the embodiment of FIG. 2B, switch 270 is a PFET and switch 222 is an NFET. When switches 270 and 272 are on by virtue of the SCAN LOAD signal being asserted, scan data present on scan data input node 274 drives feedback node 204, thereby driving the input to feedback inverter 210. The SCAN LOAD N signal also drives a latch load control input coupled to gate 248 of NFET 246. During loading of scan data, NFET 246 is turned off, thereby disabling the lower portion of forward inverter 240 in the same manner that the lower portion of feedback inverter 210 is disabled during normal latch loading. One can see, therefore, that a portion of feedback inverter 210 is disabled during a normal latch load, and a portion of forward inverter 240 is disabled during a scan data load.

The embodiment of FIG. 2B includes circuitry for loading scan data. In some embodiments, scan data is not used. In some of these embodiments, switches 270 and 272 are not present. Also in some of these embodiments, NFET 246 is not present, nor is the latch load control input coupled to gate 248 of NFET 246.

Transistors within inverters have device sizes associated therewith. For example, within feedback inverter 210, PFET 212 and NFETs 216 and 220 each occupy an area of an integrated circuit die. Likewise, within forward inverter 240, PFET 242 and NFETs 246 and 250 also each occupy an area of the integrated circuit die. FET devices, such as those in the embodiment of FIG. 2B, include diffusion regions coupled to the drain of the FET and the source of the FET, and also include gates that have a capacitive effect on nodes to which they are coupled. For example, feedback inverter 210 includes PFET 212 having a diffusion region coupled to reference node 211 and a diffusion region coupled to storage node 202. NFET 216 has a diffusion region coupled to storage node 202 and a diffusion region coupled to NFET 220. Also, NFET 220 has a diffusion region coupled to NFET 216 and a diffusion region coupled to reference node 224.

In some embodiments, reference node 211 is a more positive reference than reference node 224, and reference node 241 is a more positive reference than reference node 254. In some embodiments, reference node 211 is the same as reference node 241, and reference node 224 is the same as reference node 254, and in other embodiments, reference node 211 is not the same as reference node 241, and reference node 224 is not the same as reference node 254.

Diffusion regions can collect charge resulting from cosmic rays and particles that bombard the integrated circuit die. Particles that bombard the bulk of the integrated circuit die can cause negatively charged electrons or positively charged holes to collect in diffusion regions of FETs and cause charge accumulation. Large diffusion regions can collect more charge than small diffusion regions. When a diffusion region is small, the likelihood of a soft error occurring is decreased in part because less charge can be accumulated. Also, if a diffusion region has a capacitance coupled thereto, the likelihood of a soft error occurring is inversely related to the amount of capacitance.

If a large diffusion region is coupled to a small capacitance, the large diffusion region can collect a significant charge, and because the capacitance is small, the charge remains in the diffusion region thereby increasing the likelihood of a soft error. In contrast, if a diffusion region is small, and a capacitance coupled thereto is large, the likelihood of a soft error is decreased. The small diffusion region collects less charge than a large diffusion region, and when a large capacitance is coupled to the small diffusion region, the charge collected by the small diffusion region can be effectively dissipated across the large capacitance, thereby reducing the likelihood of a soft error.

In the embodiment of FIG. 2B, the area occupied by NFET devices is not uniform. Some NFET devices are smaller than others. Specifically, NFET devices having diffusion regions coupled to susceptible nodes, such as storage node 202 and feedback node 204, are smaller than other NFET devices. For example, within feedback inverter 210, NFET 216, which is coupled to storage node 202, has an area of y−α, and NFET 220, which is not directly coupled to storage node 202, has an area of 3(y−α). Also for example, within forward inverter 240, NFET 246, which is coupled to feedback node 204, has an area of x−δ, and NFET 250, which is not coupled directly to feedback node 204, has an area of 3(x−δ). The relative sizes of NFETs coupled to susceptible nodes is discussed more fully below with reference to FIG. 3A.

Latch 200 includes capacitor 256 coupled to feedback node 204. In one embodiment, capacitor 256 is a grounded PFET device on feedback node 204 which does not increase diffusion region size on any susceptible node of the latch. Capacitor 256 has a large capacitance value compared to the size of the diffusion regions in PFET 242 and NFET 246. When charged particles strike the integrated circuit die that includes latch 200, charge is collected in the diffusion regions coupled to feedback node 204. The diffusion regions coupled to feedback node 204 include diffusion regions of PFET 242, NFET 246, PFET 270, and NFET 272. In the embodiment of FIG. 2B, the diffusion regions coupled to feedback node 204 are small relative to the capacitance value of capacitor 256, such that charge collected in the diffusion regions can be effectively dissipated on capacitor 256 to decrease the likelihood of a soft error.

The addition of capacitor 256 on feedback node 204 has little effect on the performance of latch 200 as measured by a clock-to-output time and a data set-up time. Because capacitor 256 is coupled to feedback node 204 and not to storage node 202, the clock-to-output time is not affected. When latch 200 is loaded, and the input pass gate is off, no additional capacitance appears on storage node 202 as a result of capacitor 256, so data propagates through buffer 280 onto data output node 285 at the same rate as it would without the addition of capacitor 256. Data set-up time can be increased slightly by the addition of capacitor 256 because when loading the latch, capacitor 256 charges before feedback inverter 210 drives storage node 202, thereby storing the state of the latch.

Figure 3A:
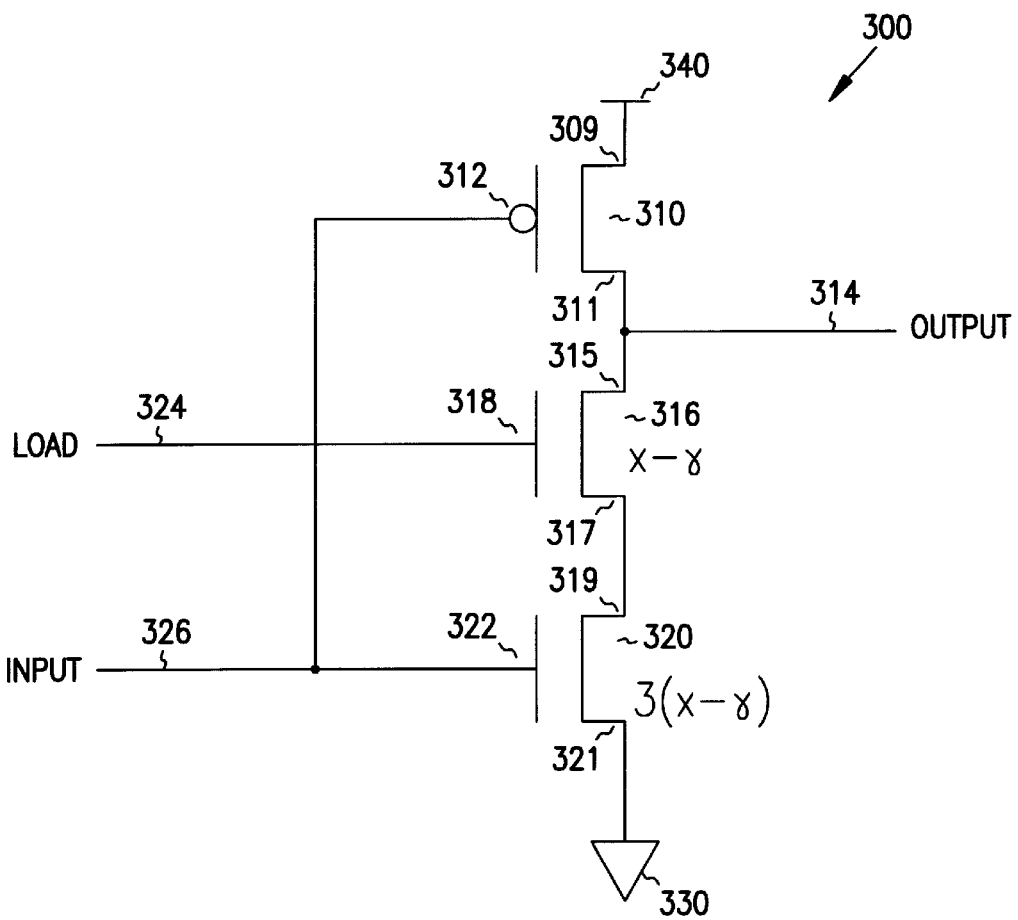
FIG. 3A is an inverter according to one embodiment of the present invention.

FIG. 3A shows an inverter in accordance with one embodiment of the present invention. Inverter 300 includes PFET 310, NFET 316, and NFET 320. PFET 310 is a pullup device coupled between reference node 340 and output node 314, and NFETs 316 and 320 are pulldown devices coupled in series between output node 314 and reference node 330. When PFET 310 is on and either of NFETs 316 and 320 are off, output node 314 is "pulled up" to near the voltage value present on reference node 340. Likewise, when both NFETs 316 and 320 are on, and PFET 310 is off, output node 314 is "pulled down" to near the voltage present on reference node 330. Each of the pullup and pulldown devices have control inputs that control the on/off state of the device. In the embodiment of FIG. 3A, control inputs are gates of FETs. For example, the control input of the pullup device is gate 312 of PFET 310, and the control inputs of the pulldown devices are gates 318 and 322 of NFETs 316 and 320 respectively.

PFET 310 includes source diffusion region 309 coupled to reference node 340 and drain diffusion region 311 coupled to output node 314. PFET 310 also includes gate 312. NFET 316 includes drain diffusion region 315 coupled to output node 314 and source diffusion region 317 coupled to the drain of NFET 320. NFET 316 also includes gate 318. NFET 320 includes drain diffusion region 319 coupled to the source of NFET 316, and source diffusion region 321 coupled to reference node 330. NFET 320 also includes gate 322.

In operation, a signal is impressed on input node 326, which is coupled to gate 322 of NFET 320 and to gate 312 of PFET 310. When a signal on input node 326 is low, NFET 320 is off and PFET 310 is on. As a result, output node 314 is coupled to reference node 340 through PFET 310. When a signal on input node 326 is high, PFET 310 is off and NFETs 316 and 320 are on. As a result, output node 314 is coupled to reference node 330 through NFETs 316 and 320.

Diffusion regions coupled to output node 314 are diffusion regions capable of collecting charge that can contribute to errors on output node 314. For example, drain diffusion region 311 of PFET 310 and drain diffusion region 315 of NFET 316 can collect charge that contributes to soft errors on output node 314. If the aforementioned diffusion regions are kept small relative to a capacitance on output node 314, the effect of accumulated charge in the diffusion regions can be reduced.

NFET 316 is shown having a size of x–δ. x–δ is a parameter of the manufacturing process used to fabricate inverter 300. In one embodiment, δ represents an area that, when subtracted from the area x, results in the smallest transistor size available in the manufacturing process. The smallest transistor size yields the smallest diffusion regions, which in turn contribute the least to soft errors resulting from charge accumulation. NFET 320 is shown having a size of 3(x–δ). In this embodiment, NFET 320 occupies three times the area of NFET 316.

The relative size difference of NFET 316 and NFET 320 has multiple effects on the operation of the circuit as a whole. NFET 316 is smaller and as a result has smaller diffusion regions and a smaller gate area. The smaller diffusion regions collect less charge than larger diffusion regions and therefore contribute less charge to soft errors on output node 314. Also, the smaller gate 318 produces less capacitive loading on load input node 324. Less capacitive loading on a potentially widely fanned-out signal node such as load input node 324 can increase the speed of operation of an integrated circuit. For example, in one embodiment, load input node 324 can be coupled to a clock input node of a datapath or other circuit element. Low capacitance on clock nodes allows clock signals to operate faster. NFET 320 is sized such that the combined drive strength of NFETs 316 and 320 is adequate to pull down output node 314 with equal or greater strength than a normal inverter. Also, gate 322 of NFET 320 has an increased area, which contributes capacitive loading on input node 326.

Figure 3B:
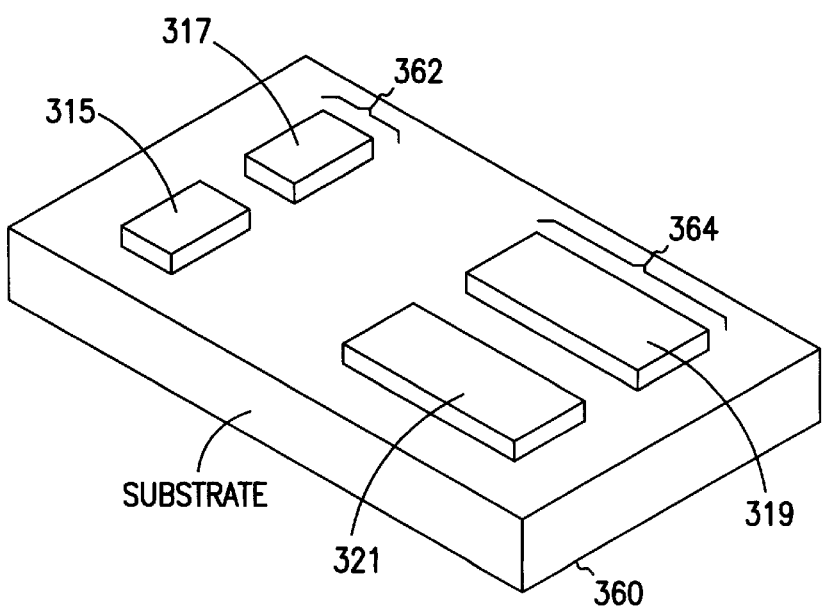
FIG. 3B is an isometric view of diffusion regions within the inverter of FIG. 3A.

FIG. 3B shows an isometric view of diffusion regions within the inverter of FIG. 3A. Substrate 360 includes drain diffusion region 315 and source diffusion region 317 of NFET 316 (FIG. 3A), and also includes drain diffusion region 319 and source diffusion region 321 of NFET 320 (FIG. 3A). To accentuate the diffusion regions, they are shown in FIG. 3B without the additional structures commonly used to build complete transistors such as gates and insulating layers. When fully interconnected within inverter 300, drain diffusion region 315 is coupled to output node 314 of inverter 300, source diffusion region 317 is coupled to drain diffusion region 319, and source diffusion region 321 is coupled to reference node 330.

As shown in FIG. 3B, the diffusion regions of NFET 316 have a width 362 and the diffusion regions of NFET 320 have a width 364. In one embodiment, width 364 is three times as large as width 362, and NFET 320 has an area three times as large as NFET 316. Drain diffusion region 315 of NFET 316 is coupled to output node 314, and as a result, accumulated charge in drain diffusion region 315 contributes to soft errors on output node 314. By reducing the size of drain diffusion region 315, less charge accumulates, and the device becomes more soft error rate tolerant.

Referring now back to FIG. 2B, forward inverter 240 and feedback inverter 210 can be inverter 300 (FIG. 3A). When both forward inverter 240 and feedback inverter 210 include the properties of inverter 300, NFET 250 occupies an area three times as large as NFET 246 and NFET 220 occupies three times as much area as NFET 216. This results in an increased capacitance on storage node 202 as a result of gate 252 having increased area. The increased capacitance on storage node 202 helps to dissipate charge collected in diffusion regions of PFET 212, NFET 216, PFET 260, and NFET 262. The increased capacitance and decreased diffusion region area coupled to storage node 202 combine to increase the tolerance to soft errors as a result of accumulated charge. The relative sizes of the NFETs also results in a decreased capacitance on latch load input nodes, such as latch load input node 226, and the scan load input node coupled to gate 248 of NFET 246.

In the embodiment of FIG. 2B, NFETs in feedback inverter 210 are sized in multiples of y–α, and NPETs in forward inverter 240 are sized in multiples of x–δ. In this embodiment, y can be equal to x, α can be equal to δ, both can be equal, or both can be unequal. When both are equal, NFET 218 is the same size as NFET 246, and NFET 220 is the same size as NFET 250, and forward inverter is substantially the same as feedback inverter 210.

In some embodiments, soft error rate tolerance is increased further by reducing the size of diffusion regions within pass gates coupled to susceptible nodes within the latch. For example, because scan circuitry is utilized mainly for testing purposes, scan pass gate performance can be traded for soft error rate tolerance. In these embodiments, both PFET 270 and NFET 272 within the scan pass gate are downsized to reduce the area of diffusion regions on feedback node 204 which in turn increases soft error rate tolerance. In the embodiment of FIG. 2B, both PFET 270 and NFET 272 are reduced by a factor of four. Also in this embodiment, NFET 262 of the input pass gate is reduced in size to about one half the size of PFET 260. Reducing the size of NFET 262 causes a slight decrease in speed, but also causes a corresponding increase in soft error rate tolerance due to the reduced area of diffusion regions coupled to storage node 202.

Figure 4:
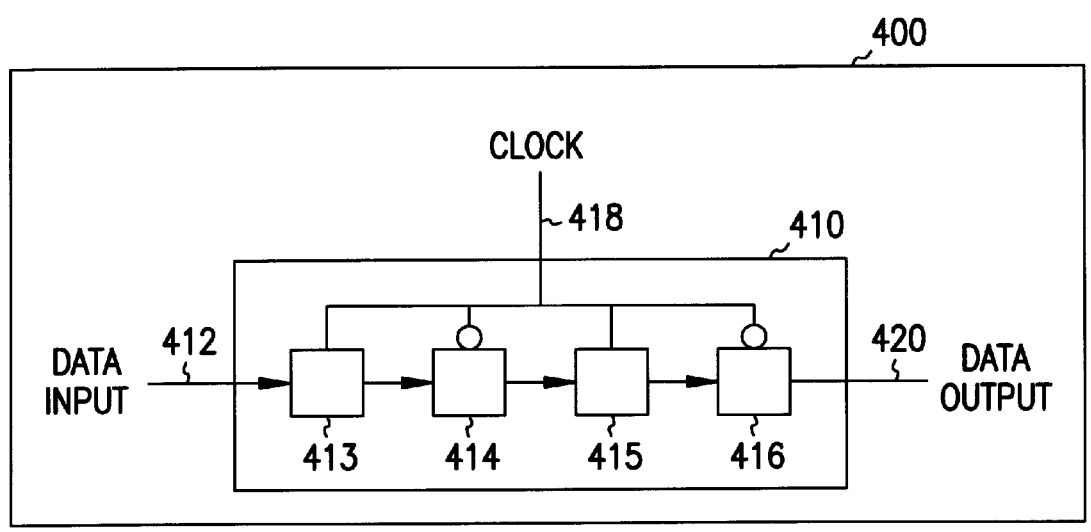
FIG. 4 is an integrated circuit according to one embodiment of the present invention.

FIG. 4 shows an integrated circuit in accordance with one embodiment of the present invention. Integrated circuit 400 includes data path 410, which in turn includes latches 413, 414, 415, and 416. Latches 413–416 can be any embodiment disclosed herein, such as latch 100 or latch 200. Latch 413 receives data on data input node 412 which corresponds to data input node 264 (FIG. 2B). Latch 413 outputs data which is then input to latch 414. After latch 414, the data travels to latch 415 and latch 416 in a like manner. Latches 413–416 receive a clock signal on clock node 418. The clock signal shown in FIG. 4 corresponds to the LATCH LOAD signal in FIG. 2B. Latches 413 and 415 respond to one edge of a clock signal on clock node 418, and latches 414 and 416 respond to the opposite edge of the clock signal on clock node 418.

Integrated circuit 400 can be any integrated circuit capable of including a latch such as latch 100 (FIG. 2A) or latch 200 (FIG. 2B). Integrated circuit 400 can be a processor such as a microprocessor, a digital signal processor, a microcontroller, or the like. Integrated circuit 400 can also be an integrated circuit other than a processor such as an application-specific integrated circuit (ASIC), or a communications device.

Conclusion

A latch having increased soft error rate tolerance has been described. The latch includes cross-coupled inverters having transistors with varying sizes. Diffusion regions of transistors coupled to storage nodes are kept small to reduce the effect of charge accumulation resulting from particles bombarding the bulk of an integrated circuit die. Transistors having gates coupled to the storage nodes are increased in size to increase the capacitance on the storage nodes. The reduced size of diffusion regions and increased size of gates on storage nodes combine to reduce the effects of accumulated charge. Diffusion region area is further reduced by reducing the size of pass gates that load normal data and scan data. A large capacitor is coupled to a feedback node within the cross-coupled inverters to further reduce the effect of accumulated charge.

It is to be understood that the above description is intended to be illustrative, and not restrictive. Many other embodiments will be apparent to those of skill in the art upon reading and understanding the above description. The scope of the invention should, therefore, be determined with reference to the appended claims, along with the full scope of equivalents to which such claims are entitled.

What is claimed is:

1. An inverter having increased soft error rate tolerance comprising:
   an input node and an output node;
   a pullup device coupled between a reference node and the output node; and
   a plurality of pulldown devices coupled in series between the output node and a second reference node, each of the plurality of pulldown devices having at least one diffusion region, the diffusion regions occupying unequal areas;
   wherein the plurality of pulldown devices comprises a first pulldown device and a second pulldown device, the first pulldown device being coupled to the second reference node, and the second pulldown device being coupled between the output node and the first pulldown device;
   wherein the first pulldown device includes a control input coupled to the input node; and
   wherein a diffusion region of the first pulldown device occupies a greater area than a diffusion region of the second pulldown device.

2. The inverter of claim 1 wherein the pullup device includes a control input coupled to the input node.

3. The inverter of claim 2 wherein the second pulldown device includes a control input coupled to a clock input node.

4. The inverter of claim 1 wherein the pullup device is a PFET, and the first and second pulldown devices are NFETs.

5. An inverter having increased soft error rate tolerance, the inverter comprising:
   a PFET having a gate coupled to an input node, and a diffusion region coupled to an output node;
   a first NFET having a gate coupled to the input node, a first diffusion region, and a second diffusion region coupled to a reference node; and
   a second NFET having a gate coupled to a control input node, a first diffusion region coupled to the output node, and a second diffusion region coupled to the first diffusion region of the first NFET, wherein the first diffusion region of the first NFET is a different size than the first diffusion region of the second NFET;
   the first diffusion region of the second NFET is smaller than the first diffusion region of the first NFET.

6. The inverter of claim 5 wherein the first diffusion region of the first NFET is substantially three times the first diffusion region of the second NFET.

7. A latch having increased soft error rate tolerance, the latch comprising:
   a forward inverter having an input coupled to a storage node, and an output coupled to a feedback node; and
   a feedback inverter having an input coupled to the feedback node, and an output coupled to the storage node, the feedback inverter comprising:
      a first pulldown device coupled to a first reference node, the first pulldown device having a control input of a first size coupled to the input of the feedback inverter; and
      a second pulldown device coupled between the first pulldown device and the output of the feedback inverter, the second pulldown device having a control input of a second size coupled to a latch load node of the latch;
   wherein a feedback node capacitance resulting from the first size of the control input of the first pulldown device is greater than a latch load node capacitance resulting from the second size of the control input of the second pulldown device.

8. The latch of claim 7 wherein the first and second pulldown devices are NFETs and a diffusion region of the first pulldown device is larger than a diffusion region of the second pulldown device.

9. The latch of claim 8 wherein the feedback inverter further comprises a PFET pullup device coupled between the output of the feedback inverter and a second reference node.

10. The latch of claim 7 wherein the first and second pulldown devices are NFETs and a gate of the first pulldown device is larger than a gate of the second pulldown device.

11. The latch of claim 10 wherein the feedback inverter further comprises a PFET pullup device coupled between the output of the feedback inverter and a second reference node, the PFET pullup device having a gate coupled to the feedback node.

12. The latch of claim 7 further including an input pass gate comprising an NFET and a PFET coupled in parallel, the NFET and the PFET being unequal in size.

13. The latch of claim 12 wherein the NFET of the input pass gate is smaller than the PFET of the input pass gate.

14. The latch of claim 7 wherein the forward inverter comprises:
    a third pulldown device coupled to the first reference node, the third pulldown device having a control input of a third size coupled to the input of the forward inverter; and
    a fourth pulldown device coupled between the third pulldown device and the output of the forward inverter, the fourth pulldown device having a control input of a fourth size coupled to a scan load node of the latch;
    wherein a storage node capacitance resulting from the third size of the control input of the third pulldown device is greater than a scan load node capacitance resulting from the fourth size of the control input of the fourth pulldown device.

15. The latch of claim 14 further including an input pass gate coupled to the storage node, the input pass gate comprising an NFET and a PFET coupled in parallel, the NFET and the PFET being unequal in size.

16. The latch of claim 15 further including a scan pass gate coupled to the feedback node, the scan pass gate occupying a smaller area than the input pass gate.

17. The latch of claim 7 further comprising a capacitor coupled to the feedback node.

18. An integrated circuit comprising a latch that includes a pair of cross-coupled inverters wherein each of the pair of cross-coupled inverters includes a PFET and two NFETs, the two NFETs having diffusion regions of unequal size, wherein the PFET is a pullup device, and the two NFETs are coupled in series as pulldown devices, a smaller of the two NFETs having a diffusion region coupled to the PFET, and a larger of the two NFETs including a control input coupled to an input node.

19. The integrated circuit of claim 18 wherein the smaller of the two NFETs includes a gate configured to load the latch, and wherein the PFET and a larger of the two NFETs each have a gate coupled to an inverter input node.

20. The integrated circuit of claim 19 wherein the larger of the two NFETs is substantially three times the size of the smaller of the two NFETs.

21. An integrated circuit including a data path, the data path including at least one latch, the at least one latch including a forward inverter comprising:
    a first PFET having a diffusion region;
    a first pulldown NFET having a diffusion region and having a control input coupled to an input node; and
    a second pulldown NFET having a first diffusion region coupled to the diffusion region of the first PFET and a second diffusion region coupled to the diffusion region of the first pulldown NFET, the first diffusion region of the second pulldown NFET being smaller than the diffusion region of the first pulldown NFET.

22. The integrated circuit of claim 21 wherein a gate of the first PFET and a gate of the first pulldown NFET are coupled to a storage node, and the at least one latch further comprises an input pass gate coupled to the storage node, the input pass gate comprising complementary transistors of unequal size.

23. The integrated circuit of claim 22 wherein the at least one latch further comprises a feedback inverter having a second pullup PFET with a diffusion region coupled to the storage node.

24. The integrated circuit of claim 23 wherein the feedback inverter further includes:
    a third pulldown NFET coupled to the storage node; and
    a fourth pulldown NFET coupled between the third pulldown NFET and a reference node, the fourth pulldown NFET being larger than the third pulldown NFET.

\* \* \* \* \*

UNITED STATES PATENT AND TRADEMARK OFFICE
CERTIFICATE OF CORRECTION

PATENT NO. : 6,380,781 B1
DATED : April 30, 2002
INVENTOR(S) : Tanay Karnik, Krishnamurthy Soumyanath and Shekhar Y. Borkar It is certified that error appears in the above-identified patent and that said Letters Patent is hereby corrected as shown below:

Column 3,
Line 22, delete "fall" and insert -- full --, therefor.

Signed and Sealed this

Sixteenth Day of July, 2002

*Attest:*

*Attesting Officer*

JAMES E. ROGAN
*Director of the United States Patent and Trademark Office*